(12) United States Patent
Yokoo

(10) Patent No.: US 7,928,771 B2
(45) Date of Patent: Apr. 19, 2011

(54) DRIVE SIGNAL OUTPUT CIRCUIT AND MULTI-CHIP PACKAGE

(75) Inventor: Satoshi Yokoo, Ota (JP)

(73) Assignees: Sanyo Electric Co., Ltd. (JP); Sanyo Semiconductor Co., Ltd. (JP)

( * ) Notice: Subject to any disclaimer, the term of this patent is extended or adjusted under 35 U.S.C. 154(b) by 0 days.

(21) Appl. No.: 12/499,879

(22) Filed: Jul. 9, 2009

(65) Prior Publication Data

US 2010/0007381 A1    Jan. 14, 2010

(30) Foreign Application Priority Data

Jul. 10, 2008   (JP) ................................ 2008-180772

(51) Int. Cl.
*H02P 1/00* (2006.01)
*H02P 3/00* (2006.01)
*H02P 3/20* (2006.01)
*H03K 19/094* (2006.01)

(52) U.S. Cl. ........................... 326/105; 326/82; 318/256

(58) Field of Classification Search .................... 326/82, 326/105–108; 318/256, 258, 261, 280
See application file for complete search history.

(56) References Cited

U.S. PATENT DOCUMENTS

| 5,471,122 A * | 11/1995 | Bilotti et al. ................... 318/284 |
| 6,943,510 B2 * | 9/2005 | Gorti .............................. 318/275 |
| 2006/0197488 A1 | 9/2006 | Kamiya et al. |
| 2009/0135531 A1 * | 5/2009 | Hirata .............................. 361/18 |

FOREIGN PATENT DOCUMENTS

JP        2006-246642 A      9/2006

* cited by examiner

*Primary Examiner* — Daniel D Chang
(74) *Attorney, Agent, or Firm* — Cantor Colburn LLP

(57) ABSTRACT

Input signals from a signal input terminal are input to a logic circuit, and a control signal corresponding to states of the input signals is output. The control signal is supplied to an output circuit, a plurality of transistors are controlled, and a drive signal is output corresponding to states of the transistors. In the logic circuit, the logic is switched according to the polarity of the setting signal which is input to a logic setting terminal, and a control signal corresponding to the input signal is changed.

5 Claims, 6 Drawing Sheets

M=H

| IN1 | IN2 | OUT1 | OUT2 |
|---|---|---|---|
| L | L | OFF | OFF |
| L | H | L | H |
| H | L | H | L |
| H | H | L | L |

| IN1 | IN2 | OUT1 | OUT2 |
|---|---|---|---|
| L | L | OFF | OFF |
| L | H | OFF | OFF |
| H | L | H | L |
| H | H | L | H |

FIG. 2B

| INPUT | | | | OUTPUT | | | | POSITION |
|---|---|---|---|---|---|---|---|---|
| IN1 | IN2 | IN3 | IN4 | OUT1 | OUT2 | OUT3 | OUT4 | |
| H | L | L | H | H | L | L | H | (i) |
| H | L | L | L | H | L | OFF | OFF | (ii) |
| H | L | H | L | H | L | H | L | (iii) |
| L | L | H | L | OFF | OFF | H | L | (iv) |
| L | H | H | L | L | H | H | L | (v) |
| L | H | L | L | L | H | OFF | OFF | (vi) |
| L | H | L | H | L | H | L | H | (vii) |
| L | L | L | H | OFF | OFF | L | H | (viii) |

FIG. 3

DRIVE SIGNAL OUTPUT CIRCUIT AND MULTI-CHIP PACKAGE

CROSS-REFERENCE TO RELATED APPLICATIONS

The entire disclosure of Japanese Patent Application No. 2008-180772 including specification, claims, drawings, and abstract is incorporated herein by reference.

BACKGROUND OF THE INVENTION

1. Field of the Invention

The present invention relates to a drive signal output circuit which outputs a drive signal to a load such as a motor and a multi-chip package including the drive signal output circuit.

2. Description of the Related Art

In the related art, an H bridge circuit is used in a drive circuit for a motor or the like. In the H bridge, two series connections each having a p-type transistor and an n-type transistor are placed between a power supply line and a ground line, and intermediate points of the series connections are set as a pair of outputs.

In the H bridge, a load such as a coil is connected to the pair of outputs, and a direction of current to the load is controlled by ON and OFF states of a transistor. As the control signal of each transistor, a sine wave is used, or a simple H signal and a simple L signal are also used. In the latter case, three states are generated, one indicating a current to the load in the forward direction, one indicating a backward direction, and one indicating an OFF state.

For example, in a case of a stepping motor, two coils are used, and two H bridges are used for driving the coils. A rotor position is determined based on the state of the current supplied to the two coils. Because of this, it is possible to rotate the rotor in the forward or backward direction by a desired amount by sequentially changing the state of the current supplied to the two coils in a particular order.

Normally, a signal for driving the H bridge is supplied from outside. Therefore, a circuit which drives the transistor of the H bridge based on the signal supplied from the outside is required. The driving of the load such as the stepping motor, on the other hand, is not necessarily in one mode. It is not efficient to prepare a drive signal output circuit for each load and for each of various modes.

SUMMARY OF THE INVENTION

According to various aspects of the present invention, logic of a logic circuit can be switched by a setting of a logic setting terminal. Because of this, one circuit can be used in a plurality of modes.

BRIEF DESCRIPTION OF THE DRAWINGS

A preferred embodiment of the present invention will be described in detail by reference to the drawings, wherein:

FIG. 2A is a diagram showing a truth table (M=H) of a drive signal output circuit;

FIG. 2B is a diagram showing a truth table (M=L) of a drive signal output circuit;

FIG. 3 is a diagram showing a truth table for driving a stepping motor;

DESCRIPTION OF THE PREFERRED EMBODIMENT

A preferred embodiment of the present invention will now be described with reference to the drawings.

Figure 1:
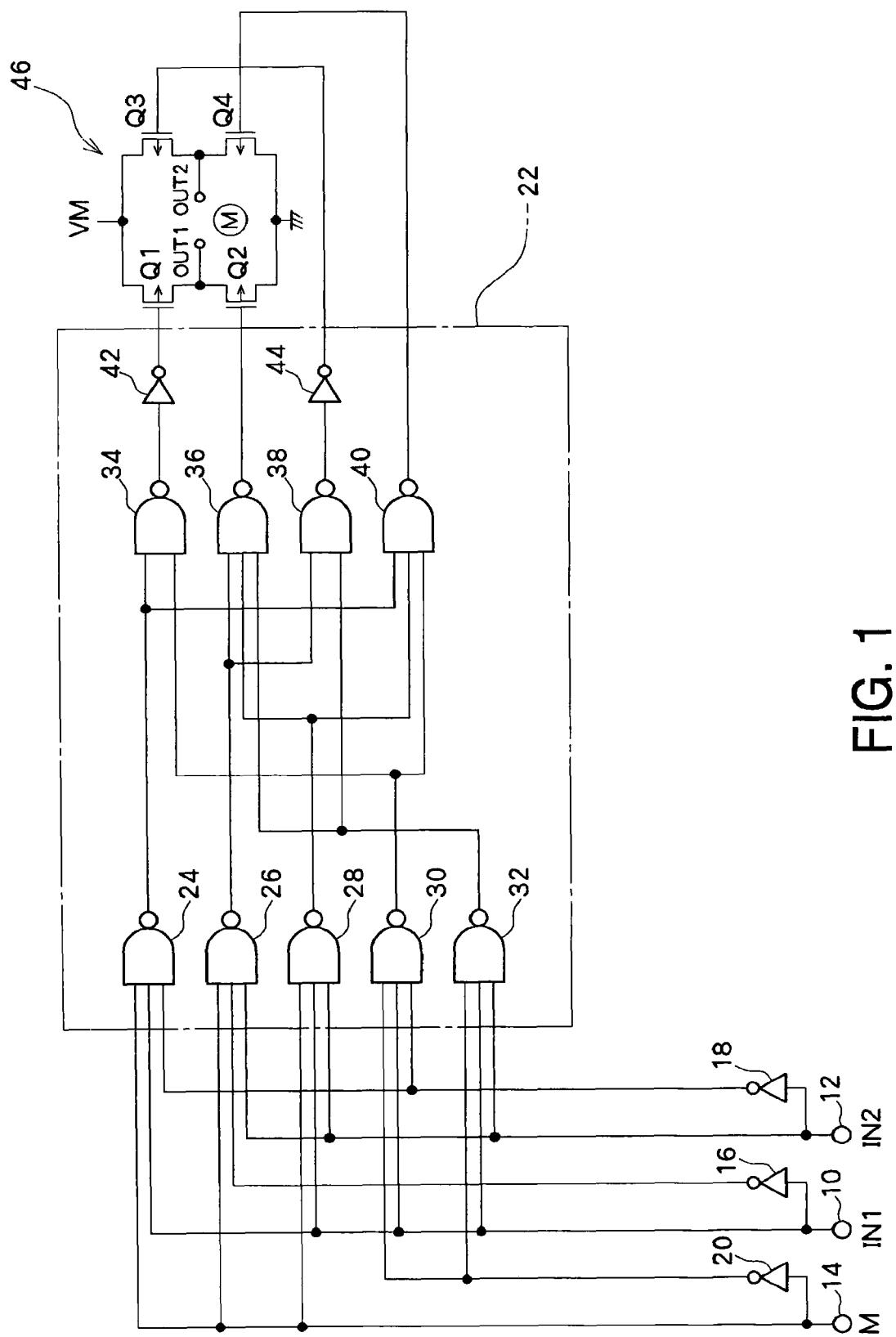
FIG. 1 is a diagram showing a structure of a drive signal output circuit.

FIG. 1 is a diagram showing a structure of a drive signal output circuit according to a preferred embodiment of the present invention. The drive signal output circuit is formed on a semiconductor chip, and receives input of two input signals IN1 and IN2 from input signal pads 10 and 12, respectively. A logic setting pad 14 is also provided, to which a setting signal M of an H level or an L level is input.

The input signals IN1 and IN2 and the setting signal M from the three pads 10, 12, and 14 are input to inverters 16, 18, and 20, respectively, and inverted signals are generated. Six signals including the signals IN1, IN2, and M and the inverted signals of these signals are input to a logic circuit 22. The logic circuit 22 comprises nine NAND gates 24~40. The signals M, IN1, and inverted IN2 are input to the NAND gate 24. The signals M, inverted IN1, and IN2 are input to the NAND gate 26. The signals M, IN1, and IN2 are input to the NAND gate 28. The signals inverted M, IN1, and inverted IN2 are input to the NAND gate 30. The signals inverted M, IN1, and IN2 are input to the NAND gate 32. An output of the NAND gate 24 and an output of the NAND gate 30 are input to the NAND gate 34. An output of the NAND gate 26, an output of the NAND gate 28, and an output of the NAND gate 32 are input to the NAND gate 36. The output of the NAND gate 26 and the output of the NAND gate 32 are input to the NAND gate 38. The output of the NAND gate 24, the output of the NAND gate 28, and the output of the NAND gate 30 are input to the NAND gate 40.

Outputs of the NAND gates 34 and 38 are inverted by inverters 42 and 44. These inverted outputs and the outputs of the NAND gates 34 and 40 are input, as four outputs of the logic circuit 22, to an H bridge circuit 46 which is an output circuit.

The H bridge circuit 46 comprises four transistors Q1~Q4 placed between a power supply and ground. A p-channel transistor Q1 has a source connected to the power supply and a drain connected to a drain of an n-channel transistor Q2. A source of the n-channel transistor Q2 is connected to the ground. A p-channel transistor Q3 has a source connected to the power supply and a drain connected to a drain of an n-channel transistor Q4. A source of the n-channel transistor Q4 is connected to the ground. A connection point between the transistors Q1 and Q2 is connected to an output terminal OUT1 and a connection point between the transistors Q3 and Q4 is connected to an output terminal OUT2.

The output of the inverter 42 is supplied to a gate of the transistor Q1, the output of the NAND gate 36 is supplied to a gate of the transistor Q2, the output of the inverter 44 is supplied to a gate of the transistor Q3, and the output of the NAND gate 40 is supplied to a gate of the transistor Q4.

A load is connected between the output terminals OUT1 and OUT2. In the case of the above-described circuit, the states of OUT1 and OUT2 based on the states of the input signals IN1 and IN2 are as shown in FIGS. 2A and 2B. FIG. 2A shows cases when the logic setting signal M is at the H level and FIG. 2B shows cases when the logic setting signal M is at the L level. In the case of FIG. 2A where the logic setting signal is at the H level as described, the levels to be supplied to the terminals of the load are of four types of OFF-OFF, L-H, H-L, and L-L. According to these, the current for the load may be switched OFF, the current for the load may be applied in the forward direction (or backward direction) or backward direction (or forward direction), and the terminals of the load may be short-circuited to ground. Therefore, in the case of a stepping motor, four states may be realized including a state where no current is supplied to the coil, a current of a forward direction or backward direction is supplied to the coil, and a state where the terminals of the coil are connected to ground and a brake is applied to the motor.

In the case of FIG. 2B where the logic setting signal M is at the L level, the levels supplied to the terminals of the load are of four types including OFF-OFF, OFF-OFF, L-H and H-L. With such a configuration, the current for the load may be switched OFF, or the current for the load may be applied in the forward direction (or backward direction) or backward direction (forward direction). In the case of the stepping motor, three states may be realized including a state where no current is supplied to the coil, a state where a current of forward direction is supplied, and a state where a current of backward direction is supplied.

In this manner, the states of the output terminals OUT1 and OUT2 with respect to the states of the input signals IN1 and IN2 can be switched with the logic setting signal M.

In a stepping motor, because two coils, that is, an x-axis coil and a y-axis coil, are provided, another set of a circuitry similar to FIG. 1 is provided. FIG. 3 shows a truth table for this configuration. In FIG. 3, input signals for the other coil are represented by IN3 and IN4 and output signals of the other coil are represented by OUT3 and OUT4. In this manner, the inputs IN1 and IN2 are in eight states, that is, H-L, H-L, H-L, L-L, L-H, L-H, L-H, and L-L, with the corresponding inputs IN3 and IN4 being L-H, L-L, H-L, H-L, H-L, and L-L. In other words, the states are shifted by 2 steps. Because 8 steps correspond to 360°, the shift corresponds to 90°. Therefore, the output signals OUT3 and OUT4 have the phases shifted by 90° from the output signals OUT1 and OUT2, and currents having the phase shifted by 90° are supplied to the x-axis coil and the y-axis coil.

Figure 4B:
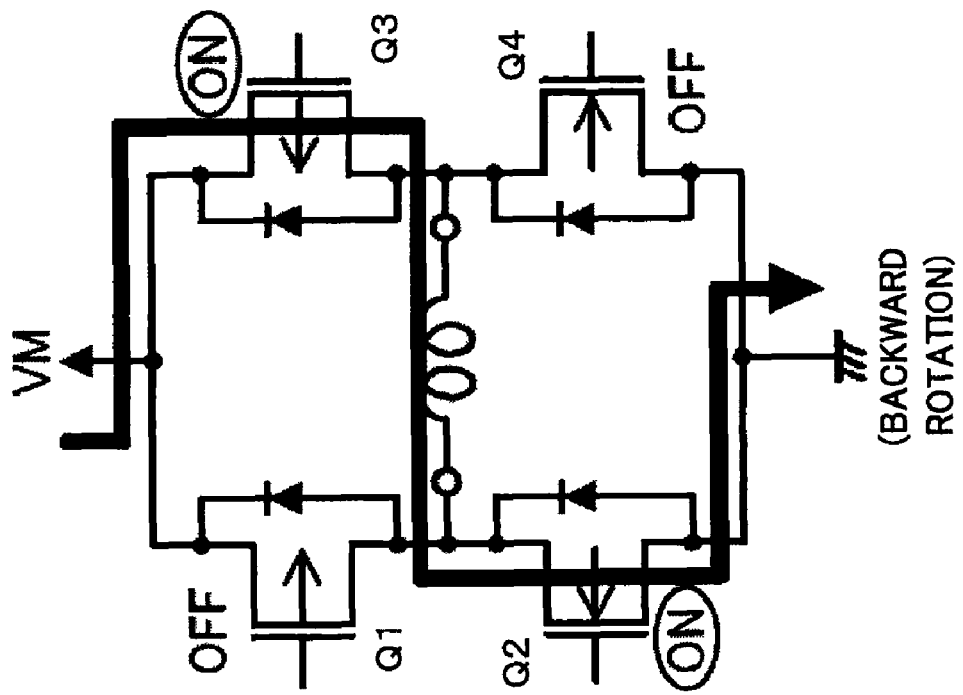
FIG. 4B is a diagram showing current of the H bridge during a backward rotation.
Figure 4A:
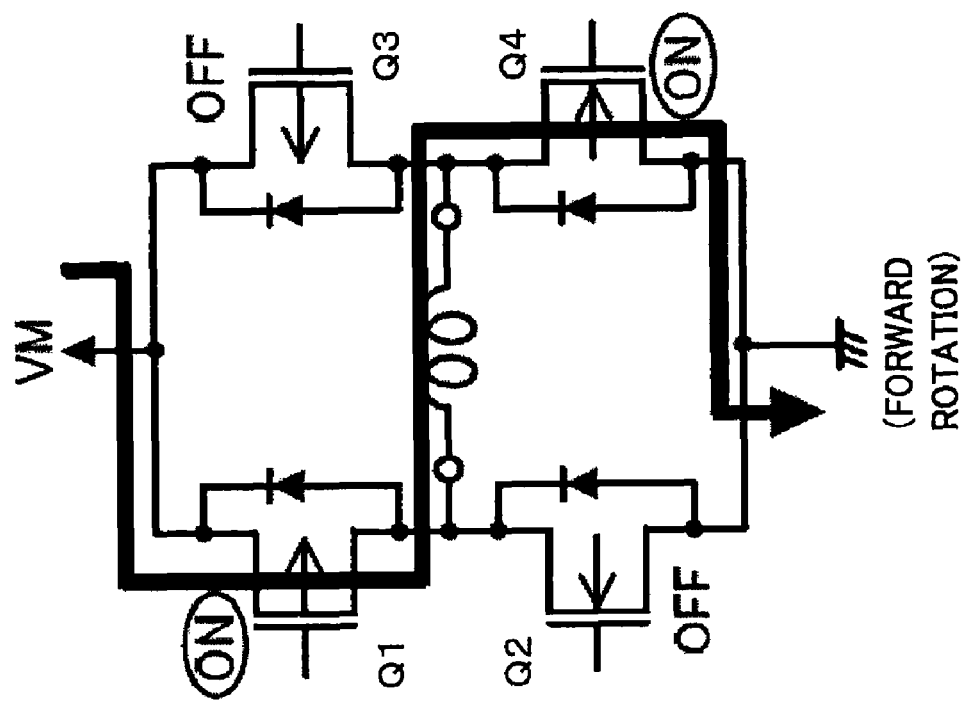
FIG. 4A is a diagram showing current of the H bridge during a forward rotation.
Figure 5:
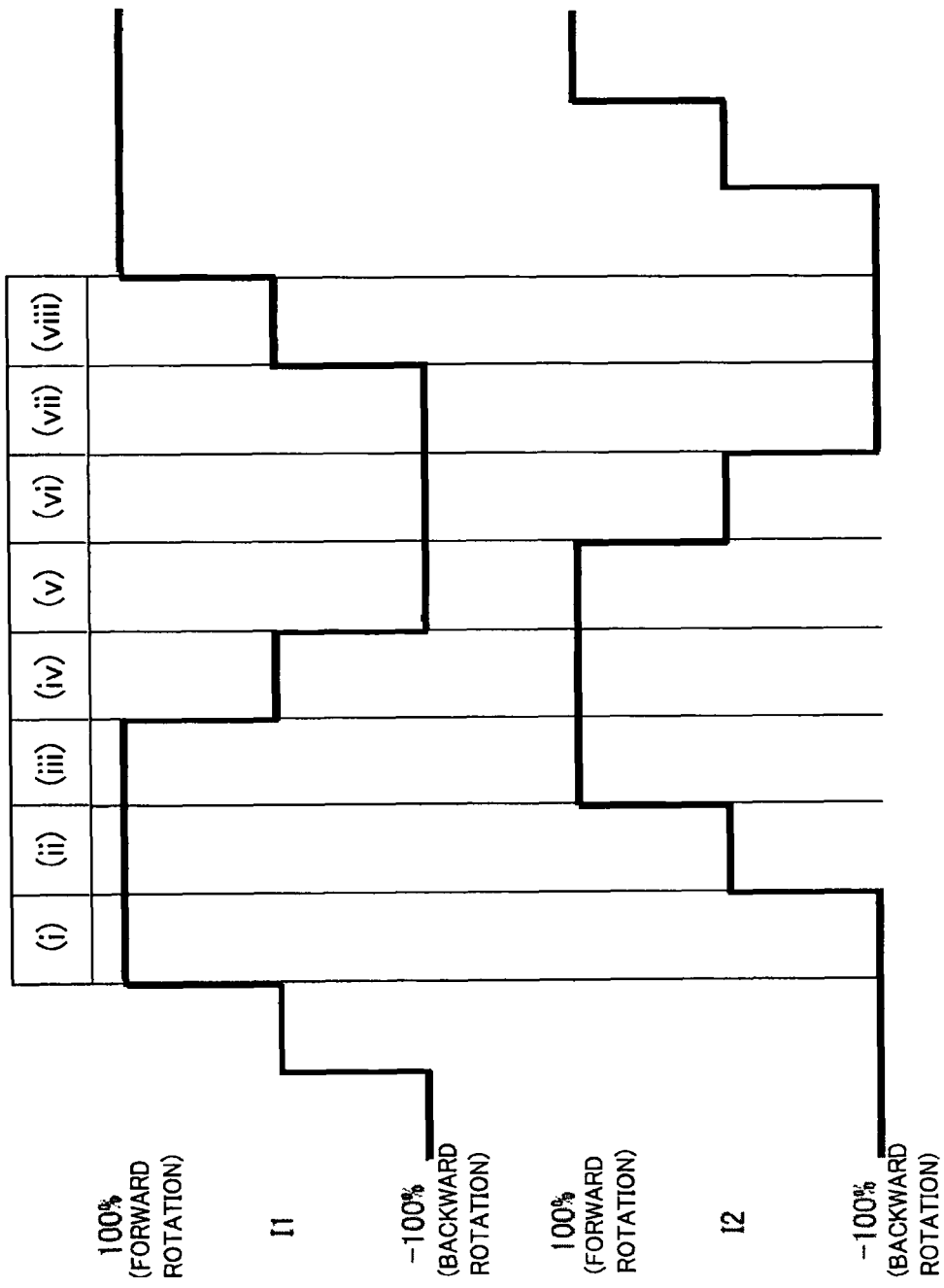
FIG. 5 is a diagram showing a coil current.

FIG. 4A shows a state of the current where the output signals OUT1 and OUT2 are H-L and FIG. 4B shows a state of current where the output signals OUT3 and OUT4 are H-L. When the eight states of FIG. 3 correspond to rotor positions 1~8, the coil current driven with the output signals OUT1 and OUT2 is I1 shown at the upper section of FIG. 5 and the coil current driven with the output signals OUT3 and OUT4 is I2 shown at the lower section of FIG. 5. As shown, the currents I1 and I2 have phases which differ by 90°. For example, when I1 is set for the x-axis coil, I2 is set for the y-axis coil, the outputs signals OUT1, OUT2, OUT3, OUT4 are H-L and H-L with −45°, in the state 1, the rotor is at −45°, in the state 2, the rotor is at 0°, and so on, with the phase progressing by 45° for each subsequent position. Therefore, by sequentially changing the input signal as shown in FIG. 3, it is possible to advance the stepping motor by one step (45°).

Although not shown in FIGS. 3 and 4, by setting all of the input signals IN1, IN2, IN3, and IN4 to the H level, it is possible to switch the transistors Q2 and Q4 of the two H bridges ON, so that a brake may be applied.

Figure 6:
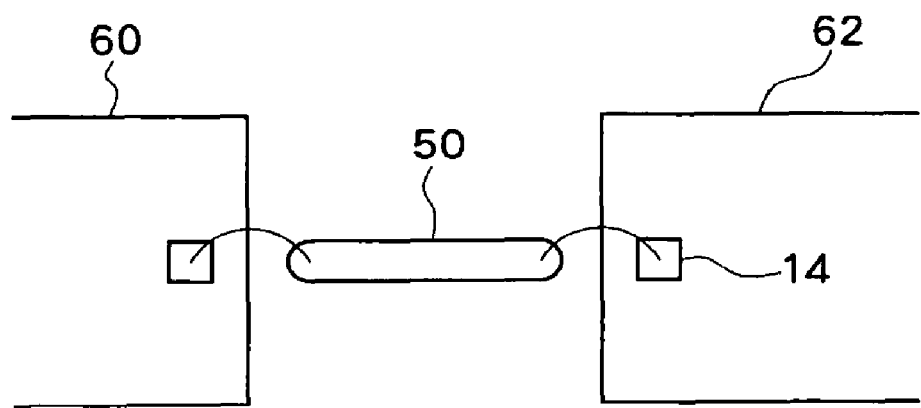
FIG. 6 is a diagram showing a connection of a logic chip and a driver chip.

FIG. 6 shows an example configuration where a logic chip 60, which is a semiconductor chip such as a microcomputer, and a driver chip 62, which is a semiconductor chip of an analog circuit having the driving signal output circuit of the present embodiment, are placed on one board. A circuit for shake correction of a camera is preferably formed in such a multi-chip package where a driver chip and the logic chip (microcomputer) are mounted on one package. In FIG. 6, only the structure of transmission of the logic setting signal M is shown. In this manner, a pad of the logic chip 60 for outputting the logic setting signal M and a pad 50 on the board are connected by a wire bonding and the pad 50 and a pad 14 of the driver chip 62 for logic setting signal are connected by a wire bonding.

With this structure, the logic of the logic circuit 22 in the drive signal output circuit of the present embodiment can be switched by the logic setting signal M from the logic chip 60. That is, the logic in the driver chip can be easily switched by a signal from the logic chip such as a microcomputer.

Figure 7:
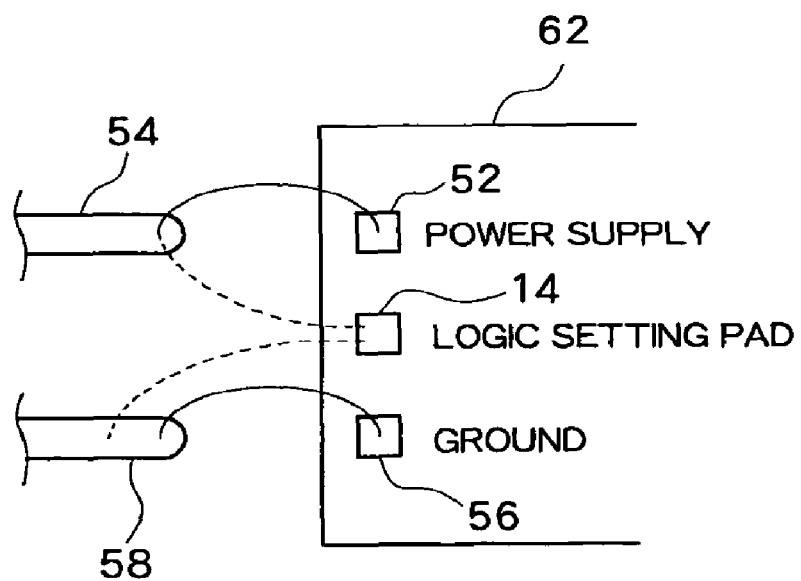
FIG. 7 is a diagram showing a setting of a logic setting pad.

FIG. 7 shows another configuration. A driver chip 62 is provided on a board, a power supply pad 52 of the driver chip 62 is connected to a lead 54, and a ground pad 56 is connected to a lead 58. By connecting the pad 14 for logic setting to one of the leads 54 and 58, it is possible to set the logic setting signal M to one of the H level and the L level. In particular, the pad 14 for logic setting is placed between the power supply pad 52 and the ground pad 56 and the leads 54 and 68 are also placed at positions corresponding to the power supply pad 52 and the ground pad 56. The logic setting pad 14 is not connected to any structure other than the leads 54 and 58. Therefore, even when the logic setting pad 14 is connected to one of the leads 54 and 58 by a wire boding, the wire is not tangled with other wires.

In the present embodiment, the stepping motor is connected between the outputs OUT1 and OUT2. As described, because the stepping motor comprises the x-axis coil and the y-axis coil, two H bridges are required. However, if the coil is a voice coil or the like, only one H bridge is required. Alternatively, it is also preferable to use n-type transistors for the transistors Q1 and Q3. In this case, the inverters 42 and 44 in FIG. 1 are not required, and the outputs of the NAND gates 34 and 38 are boosted with a charge pump or the like and supplied to the gates of the transistors Q1 and Q3. By using n-type transistors for all transistors, it is possible to improve the current capability.

What is claimed is:
1. A driving signal output circuit comprising:
   a signal input terminal to which two input signals are input;
   a logic circuit to which the two input signals from the signal input terminal are input and which outputs a plurality of control signals corresponding to four states created by high level and low level of the two input signals;
   an output circuit which includes a plurality of transistors which are controlled by the plurality of control signals, and which outputs a drive signal for driving a load, the drive signal corresponding to states of the plurality of transistors; and
   a logic setting terminal to which a setting signal is input, wherein the setting signal assumes either high level or low level, wherein
   the plurality of control signals have:
      a first mode for controlling the plurality of transistors of the output circuit to generate four states in accordance with the four states of the input signals, wherein the generated four states include a state in which a current is supplied to the load in a forward direction, a state in which a current is supplied to the load in a backward direction, a state in which the terminals of the load are isolated, and a state in which the terminals of the load are short-circuited; and
      a second mode for controlling the plurality of transistors of the output circuit to generate three states in accor- dance with the four states of the input signals, wherein the generated three states include a state in which a current is supplied to the load in a forward direction, a state in which a current is supplied to the load in a backward direction, and a state in which the terminals of the load are isolated, and in the logic circuit, whether to generate the plurality of control signals of the first mode or to generate the plurality of control signals of the second mode is switched according to high level or low level of the one setting signal which is input to the logic setting terminal.

2. The drive signal output circuit according to claim 1, wherein
the output circuit is an H bridge circuit in which two series connections, each of two transistors, are placed between a power supply line and a ground line, and intermediate points of the series connections are a pair of outputs.

3. The drive signal output circuit according to claim 1, wherein
the drive signal output circuit is formed in a driver chip placed on a board, a power supply pad and a ground pad are placed on the driver chip, and the logic setting terminal of the driver chip is connected to one of a lead connected to a power supply pad and a lead connected to a ground pad, so that the logic setting signal is set to an H level or an L level.

4. A multi-chip package, comprising:
a driver chip having a drive signal output circuit comprising:
  a signal input terminal to which two input signals are input,
  a logic circuit to which the two input signals from the signal input terminal are input and which outputs a plurality of control signals corresponding to four states created by high level and low level of the two input signals;
  an output circuit which includes a plurality of transistors which are controlled by the plurality of control signals, and which outputs a drive signal for driving a load, the drive signal corresponding to states of the plurality of transistors, and
  a logic setting terminal to which a setting signal is input, wherein the setting signal assumes either high level or low level,
the plurality of control signals have:
  a first mode for controlling the plurality of transistors of the output circuit to generate four states in accordance with the four states of the input signals, wherein the generated four states include a state in which a current is supplied to the load in a forward direction, a state in which a current is supplied to the load in a backward direction, a state in which the terminals of the load are isolated, and a state in which the terminals of the load are short-circuited; and
  a second mode for controlling the plurality of transistors of the output circuit to generate three states in accordance with the four states of the input signals, wherein the generated three states include a state in which a current is supplied to the load in a forward direction, a state in which a current is supplied to the load in a backward direction, and a state in which the terminals of the load are isolated, and
wherein, in the logic circuit, whether to generate the plurality of control signals of the first mode or to generate the plurality of control signals of the second mode is switched according to high level or low level of the one setting signal which is input to the logic setting terminal, wherein
the driver chip and the logic chip are formed on a board, a pad which outputs the logic setting signal in the logic chip and a pad on the board are connected by a wire bonding, the pad and the logic setting terminal of the driver chip are connected by a wire bonding, and logic of the logic circuit of the driver chip is switched by the logic setting signal from the logic chip.

5. The multi-chip package according to claim 4, wherein
the drive signal output circuit is formed in the driver chip placed on the board, a power supply pad and a ground pad are provided in the driver chip, and the logic setting terminal of the driver chip is connected to one of a lead connected to the power supply pad and a lead connected to the ground pad, so that the logic setting signal is set to an H level or an L level.

* * * * *